(12) United States Patent
Rangarajan et al.

(10) Patent No.: US 6,649,426 B2
(45) Date of Patent: Nov. 18, 2003

(54) SYSTEM AND METHOD FOR ACTIVE CONTROL OF SPACER DEPOSITION

(75) Inventors: Bharath Rangarajan, Santa Clara, CA (US); Michael K. Templeton, Atherton, CA (US); Bhanwar Singh, Morgan Hill, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 114 days.

(21) Appl. No.: 09/893,824

(22) Filed: Jun. 28, 2001

(65) Prior Publication Data

US 2003/0153104 A1 Aug. 14, 2003

(51) Int. Cl.$^7$ .......................... G01R 31/26; H01L 21/66; H01L 21/00
(52) U.S. Cl. ............................. 438/14; 438/16; 438/18; 438/29; 438/30; 438/32
(58) Field of Search ........................... 438/29, 30–47, 438/14–18, 800

(56) References Cited

U.S. PATENT DOCUMENTS

| 5,291,415 | A | * | 3/1994 | Zarowin et al. | ............. | 700/188 |
| 5,375,064 | A | * | 12/1994 | Bollinger | ................... | 700/188 |
| 5,479,309 | A | * | 12/1995 | Kato et al. | ................... | 360/121 |
| 5,688,415 | A | * | 11/1997 | Bollinger et al. | ...... | 219/121.41 |
| 5,949,570 | A | * | 9/1999 | Shiono et al. | ............. | 359/291 |
| 5,985,025 | A | * | 11/1999 | Celii et al. | ..................... | 117/85 |
| 6,071,749 | A | * | 6/2000 | May et al. | ..................... | 438/11 |
| 6,133,132 | A | * | 10/2000 | Toprac et al. | ............... | 438/595 |
| 6,228,340 | B1 | * | 5/2001 | Imhof et al. | ................. | 423/338 |
| 6,275,277 | B1 | * | 8/2001 | Walker et al. | ............... | 349/113 |
| 6,287,877 | B1 | * | 9/2001 | Williams et al. | ............... | 438/14 |
| 6,379,984 | B1 | * | 4/2002 | Sandberg et al. | ............. | 438/29 |
| 6,409,879 | B1 | * | 6/2002 | Toprac et al. | .......... | 156/345.24 |
| 6,410,351 | B1 | * | 6/2002 | Bode et al. | .................... | 438/14 |
| 6,470,752 | B2 | * | 10/2002 | Satoh | .......................... | 73/655 |
| 2002/0126364 | A1 | * | 9/2002 | Miles | .......................... | 438/29 |
| 2002/0159668 | A1 | * | 10/2002 | Williams et al. | ............... | 385/3 |

OTHER PUBLICATIONS

S. Chang et al., "Micromechanical Structrues In Amorphous Silicon", 1991, IEEE. pp. 751–754.*

* cited by examiner

Primary Examiner—Wael Fahmy
Assistant Examiner—Shrinivas H. Rao
(74) Attorney, Agent, or Firm—Amin & Turocy, LLP

(57) ABSTRACT

The present invention relates to systems and methods to regulate spacer deposition. The present invention employs a spacer deposition controller to control a spacer deposition component that deposits a spacer on a portion of a wafer. During and/or after spacer deposition, light can be directed at the spacer, wherein light reflected from the spacer is measured to determine parameters associated with the spacer deposition process. A processor operatively coupled to a measurement system and the spacer deposition controller utilizes the parameters to determine if the spacer process is proceeding in a suitable manner via comparing the measured parameters with stored acceptable parameters. If it is determined that the spacer deposition process is not proceeding as desired, then the measured parameters can be employed by the spacer deposition controller to adjust the spacer deposition process on the portion of the wafer and on subsequent portions of wafers.

10 Claims, 16 Drawing Sheets

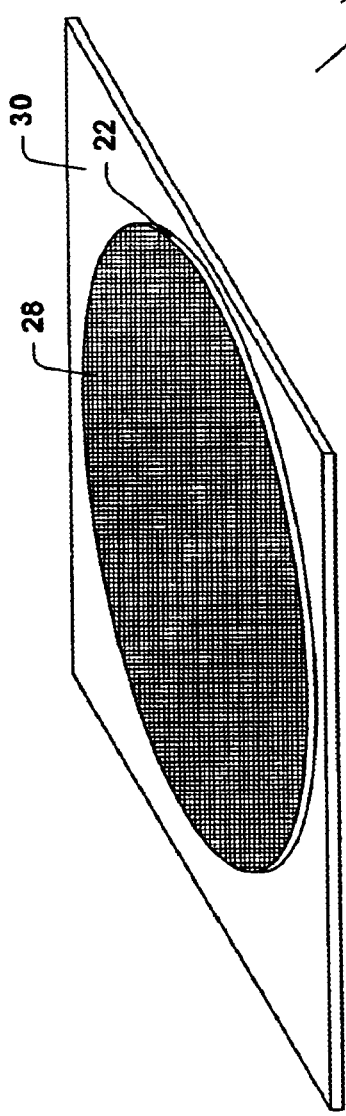
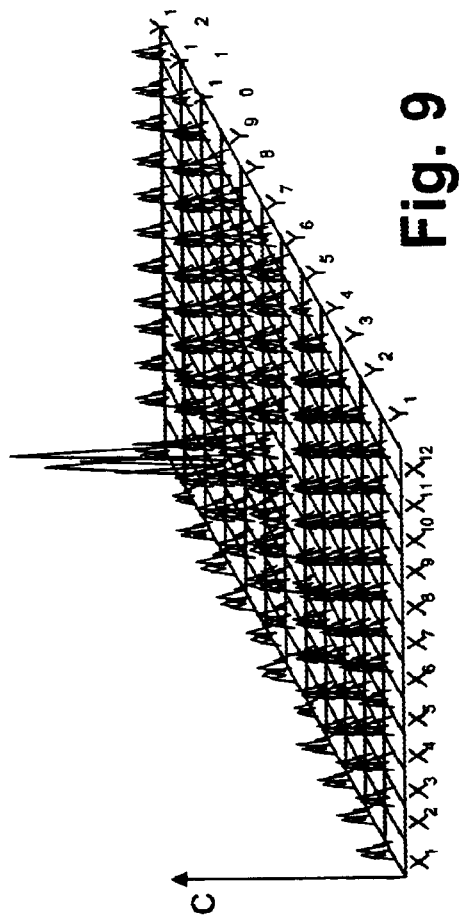
Fig. 8
Fig. 9
Fig. 10

SYSTEM AND METHOD FOR ACTIVE CONTROL OF SPACER DEPOSITION

TECHNICAL FIELD

The present invention generally relates to semiconductor processing, and in particular to a system for selective control of spacer deposition and post spacer deposition etch processes based on spacer deposition analysis.

BACKGROUND

In the semiconductor industry, there is a continuing trend toward higher device densities. To achieve these high densities there have been, and continue to be, efforts toward scaling down device dimensions (e.g., at sub micron levels) on semiconductor wafers. In order to accomplish such high device packing densities, smaller and smaller feature sizes are required. This may include the width and spacing of spacer materials, interconnecting lines, spacing and diameter of contact holes, and the surface geometry such as corners and edges of various features. Since each wafer employed in semiconductor manufacturing may be different, conventional systems may require averaging values associated with spacer deposition, or may require depositing an excess amount of spacer to insure that a minimally acceptable amount of spacer is deposited. Such conventional system suffer, therefore, from not being able to adapt to the unique critical dimensions found on any individual wafer as it is being employed in semiconductor manufacture.

The process of manufacturing semiconductors, or integrated circuits (commonly called ICs, or chips), typically consists of more than a hundred steps, during which hundreds of copies of an integrated circuit may be formed on a single wafer. Generally, the process involves creating several patterned layers on and into the substrate that ultimately forms a complete integrated circuit. This layering process creates electrically active regions in and on the semiconductor wafer surface. The electrically active regions may need to be separated from each other by insulating and/or spacing material. Conventional systems suffer from not being able to adapt processes to the individual characteristics associated with the electrically active regions on a wafer and thus yields may be less than possible.

The requirement of small features with close spacing between adjacent features requires high-resolution photolithographic processes. In general, lithography refers to processes for pattern transfer between various media. It is a technique used for integrated circuit fabrication in which a silicon slice, the wafer, is coated uniformly with a radiation-sensitive film, the resist and an exposing source (such as optical light, x-rays, etc.) illuminates selected areas of the surface through an intervening master template, the mask, for a particular pattern. The lithographic coating is generally a radiation-sensitive coating suitable for receiving a projected image of the subject pattern. Once the image is projected, it is indelibly formed in the coating. The projected image may be either a negative or a positive image of the subject pattern. Exposure of the coating through a photomask causes the image area to become either more or less soluble (depending on the coating) in a particular solvent developer. The more soluble areas are removed in the developing process to leave the pattern image in the coating as less soluble polymer.

The ability to reduce the size of computer chips is driven by lithography technology, which in turn relies upon several lithographic parameters such as spacer deposition and formation. Due to the extremely fine patterns that are exposed on the photo resist, controlling the deposition and formation of spacer materials used to separate one component on a wafer from other components are significant factors in achieving desired critical dimensions and packing densities. Thinner and more accurately measured spacer deposits facilitate achieving the higher packing densities. Due to conventional non-uniform spacer deposition and inaccurate spacer deposition monitoring techniques, spacers having a thickness greater than the minimum required may be deposited using accepted deposition processes thus reducing yields in systems employing such conventional spacer deposition.

SUMMARY

The following presents a simplified summary of the invention in order to provide a basic understanding of some aspects of the invention. This summary is not an extensive overview of the invention. It is not intended to identify key or critical elements of the invention and it is not intended to delineate the scope of the invention. Its sole purpose is to present some concepts of the invention in a simplified form as a prelude to the more detailed description that is presented later.

The present invention provides for a system that facilitates monitoring and controlling spacer deposition. Furthermore, the present invention facilitates adapting post spacer deposition etching by providing accurate spacer deposition thickness measurements. An exemplary system may employ one or more light sources arranged to project light on one or more gratings and/or spacer depositions on a wafer and one or more light sensing devices (e.g., photo detector, photo diode) for detecting light reflected by the one or more spacer depositions. The light reflected from the one or more gratings and/or spacer depositions is indicative of at least the spacer thickness, which may vary during the spacer deposition process and which may vary on various portions of a wafer upon which spacer is being deposited.

One or more spacer deposition components are arranged to correspond to a particular wafer portion. Each spacer deposition component may be responsible for depositing spacer on one or more particular wafer portions. The spacer deposition components are selectively driven by the system to deposit spacer at a desired thickness. The progress of the spacer deposition is monitored by the system by comparing the thickness of the spacer deposits on the wafer to stored values corresponding to an acceptable thickness. Different wafers and even different components within a wafer may benefit from varying spacer thickness. By monitoring the spacer thickness at the one or more wafer portions, the present invention facilitates selective control of spacer deposition. Furthermore, by monitoring the spacer thickness at the one or more wafer portions, the present invention facilitates adapting post spacer deposition etching processes based on accurate spacer thickness measurements, which in turn facilitates achieving desired critical dimensions. As a result, more optimal spacer deposition is achieved, which in turn increases desired critical dimensions and facilitates achieving higher packing densities on the wafer.

One particular aspect of the invention relates to a system for regulating spacer deposition. At least one spacer deposition component deposits spacer on a portion of a wafer. A spacer deposition component controller controls or regulates the at least one spacer deposition component. A system for directing light directs light to the portion of the wafer and collects light reflected from the portion of the wafer and a measuring system measures thickness parameters associated with the deposited spacer according to the light reflected from the portion of the wafer. A processor is operatively coupled to the measuring system and the spacer deposition controller. The processor receives the measured data associated with the deposited spacer from the measuring system, analyzes the measured data by comparing the measured data to stored acceptable spacer thickness values to determine necessary adjustments to the spacer deposition components via the spacer deposition controller in order to facilitate regulating spacer thickness on the portion of the wafer and on subsequent portions of wafers. In an alternative aspect of the present invention, once spacer deposition is substantially complete, spacer measurements are taken and are employed to compute etching parameters that can then be employed in one or more post spacer deposition processes to facilitate achieving desired critical dimensions.

Another aspect of the present invention relates to a method for regulating spacer deposition. The method includes defining a wafer as having one or more portions upon which spacer is deposited, directing light onto the one or more portions, collecting light reflected from the one or more portions and measuring the reflected light to determine spacer thickness on the portion. The method further includes using a processor to analyze the reflected light associated with the thickness of the spacer deposit by comparing the reflected light to stored spacer thickness acceptable values. A processor may then be employed to compute adjustments to be made to one or more spacer deposition components via a spacer deposition controller to regulate the thickness of spacer deposit. In an alternative aspect of the method, once spacer deposition is substantially complete, spacer measurements are employed to compute etching parameters that can then be employed in one or more post spacer deposition processes to facilitate achieving desired critical dimensions.

Still another aspect of the present invention relates to a method for regulating spacer deposition. The method includes partitioning a wafer into a plurality of grid blocks and using one or more spacer deposition components to deposit spacer on the wafer, where each spacer deposition component functionally corresponds to a respective grid block. The method further includes determining spacer thickness on the various portions of the wafer, where each portion corresponds to a respective grid block. Once the spacer thickness has been measured, the method includes employing a processor to coordinate controlling the spacer deposition components.

To the accomplishment of the foregoing and related ends, the invention, then, comprises the features hereinafter fully described and particularly pointed out in the claims. The following description and the annexed drawings set forth in detail certain illustrative examples of the invention. These examples are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 8 is a perspective illustration of a substrate having spacer deposited thereon in accordance with the present invention.

FIG. 9 is a representative three-dimensional grid map of spacer thickness measurements taken at grid blocks of the grid map in accordance with the present invention.

FIG. 10 is a spacer thickness measurement table correlating the spacer thickness measurements of FIG. 9 with desired values for the spacer thickness measurements in accordance with the present invention.

DETAILED DESCRIPTION

Figure 1:
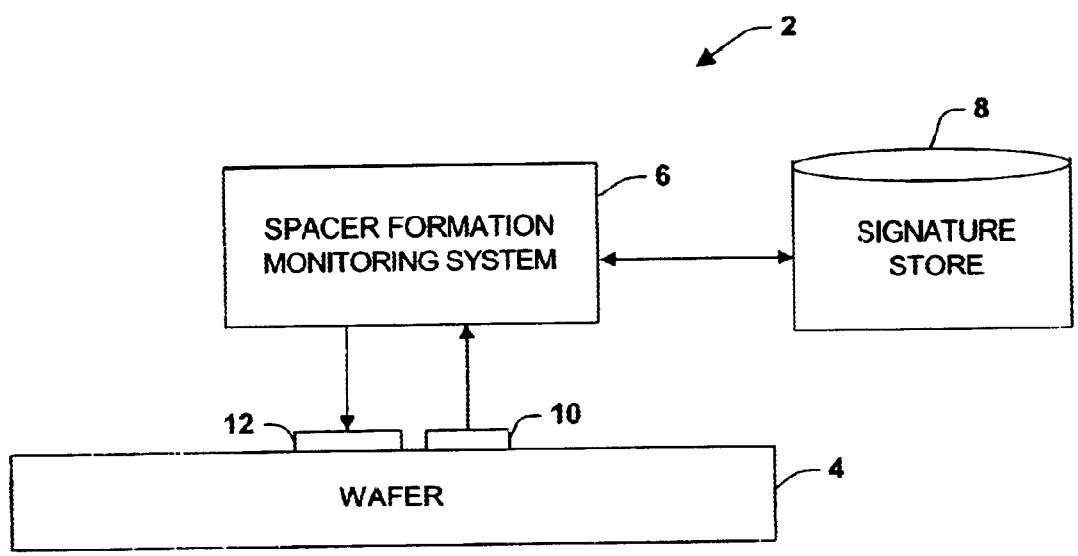
FIG. 1 is schematic block diagram of a spacer deposition monitoring system in accordance with the present invention.

The present invention will now be described with reference to the drawings, wherein like reference numerals are used to refer to like elements throughout. The present invention will be described with reference to a system for controlling spacer deposition using one or more spacer deposition components and a scatterometry system.

Referring initially to FIG. 1, an exemplary system 2 for selectively controlling spacer deposition on a wafer 4 is illustrated. The system 2 includes a spacer formation monitoring system 6 operably coupled to a signature data store 8. The spacer formation monitoring system 6 is employed to gather in situ measurements associated with spacer being deposited on the wafer 4. The measurements can include, but are not limited to, thickness measurements, coverage measurements and conformality measurements. The signature data store 8 can store data associated with analyzing light reflected from the wafer 4. The data store 8 can store data in data structures including, but not limited to one or more lists, arrays, tables, databases, stacks, heaps, linked lists and data cubes. The signature data store 8 can reside on one physical device and/or may be distributed between two or more physical devices (e.g., disk drives, tape drives, memory units).

The spacer formation monitoring system 6 can be a standalone device and can also be distributed between two or more cooperating devices and/or processes. The spacer formation monitoring system 6 can reside in one physical or logical device (e.g., computer, process).

Light reflected from and/or refracted by one or more gratings 10 and/or one or more features 12 can be analyzed to determine the acceptability of the spacer layer being deposited on the wafer 4. For example, at a first point in time during spacer deposition, the light reflected from and/or refracted by the one or more gratings 10 and/or one or more features 12 may indicate that less than a pre-determined required amount of spacer has been deposited, and thus spacer deposition should continue. But at a later point in time during spacer deposition, the light reflected from and/or refracted by the one or more gratings 10 and/or one or more features 12 may indicate that the pre-determined required amount of spacer has been deposited, and thus spacer deposition should cease. Furthermore, in an alternative aspect of the present invention, measurements made after the pre-determined required amount of spacer has been deposited can be employed to calculate one or more parameters associated with post-spacer deposition etching, to facilitate achieving desired critical dimensions.

Figure 2:
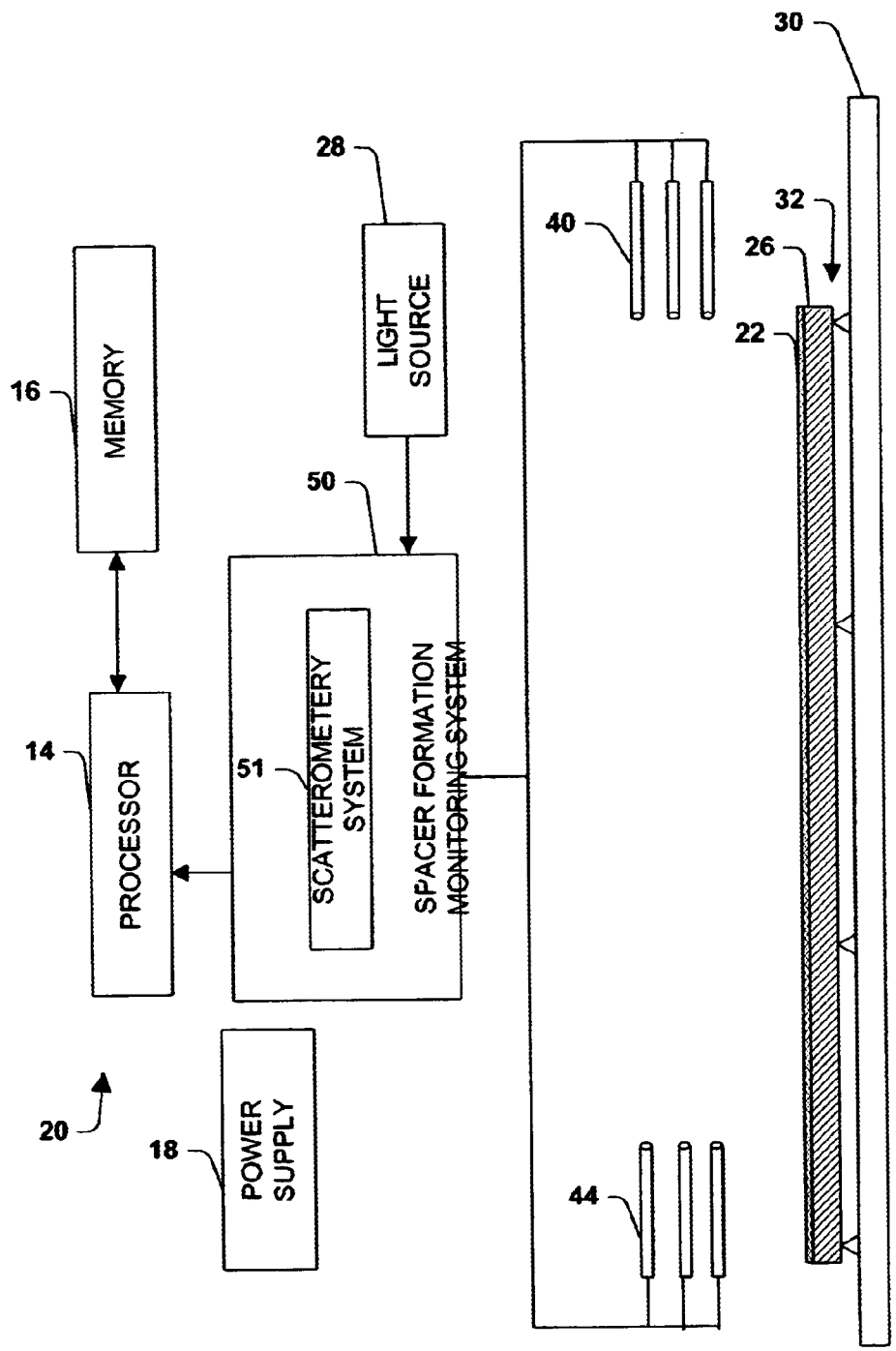
FIG. 2 is a schematic block diagram of a spacer deposition monitoring system in accordance with the present invention.

Referring now to FIG. 2, a system 20 for selectively controlling spacer deposition on a wafer 22 is illustrated. The system 20 employs one or more light sources 44 to project light onto portions of the wafer 22. Each light source 44 may be associated with one or more portions of the wafer 22. The wafer 22 may have one or more features and/or gratings located on it, upon which spacer is to be deposited conformally to a pre-determined desired thickness. Light reflected from and/or refracted by the spacer deposited on the wafer 22, including spacer deposited on the one or more features and/or gratings is collected by one or more light collecting devices 40 and is processed by a spacer formation monitoring system 50 to measure at least one parameter relating to the spacer deposit (e.g., thickness, uniformity, coverage). The reflected light is measured with respect to the incident light to determine parameters (e.g., thickness, uniformity, coverage) associated with the spacer. Thickness measurements may include vertical thickness and horizontal thickness.

The measuring system 50 includes a scatterometry system 51. It is to be appreciated that any suitable scatterometry system may be employed to carry out the present invention and such systems are intended to fall within the scope of the hereto appended claims. A light source 28 such as a laser, for example, provides light to the one or more light sources 44 via the monitoring system 50. Preferably, the light source 28 is a frequency stabilized laser however it will be appreciated that any laser or other light source (e.g., laserdiode or helium neon (HeNe) gas laser) suitable for carrying out the present invention may be employed.

A processor 14 is programmed to control and operate various components within the system 20 in order to carry out various functions described herein. The processor 14, operatively coupled to the measuring system 50, receives the measured data associated with the deposited spacer from the measuring system 50 and analyzes the measured data by comparing it to stored acceptable spacer thickness values. According to results of this analysis, the processor determines the thickness of respective spacer layer deposits on the portions of the wafer 22 and thus determines what adjustments are required to be made to the spacer deposition components to achieve desired spacer thickness in connection with spacer deposition. In particular, the processor 14 analyzes the measured data by comparing the measured data to stored spacer thickness signatures and/or values. These values may be stored in a database, for example. The stored values may include both acceptable and unacceptable spacer thickness values such that the processor can determine whether the thickness of the spacer layer is acceptable. Additionally, in an alternative example of the present invention, the reflected light is analyzed to determine one or more parameters associated with a post spacer deposition etch process to facilitate adapting the etch process to produce desired critical dimensions.

Alternatively, or in addition, the measuring system 50 determines the thickness of spacer prior to transmitting the measured data to the processor 14. In both the former and the latter cases, the processor 14 compares the measured spacer thickness with stored values to determine whether the spacer layer is acceptable or unacceptable. That is, the processor 14 may employ a non-linear training system to determine whether the spacer layer is within a pre-determined range to constitute an acceptable or unacceptable spacer layer. Although a non-linear training system is discussed above, it is to be appreciated that various aspects of the present invention may employ technologies associated with facilitating unconstrained optimization and/or minimization of error costs. Thus, non-linear training systems/methodologies (e.g., back propagation, Bayesian, fuzzy sets, non-linear regression, or other neural networking paradigms including mixture of experts, cerebella model arithmetic computer (CMACS), radial basis functions, directed search networks and function link networks) may be employed.

Upon determining that the spacer layer is unacceptable, the processor 14 may selectively mark the wafer to be corrected or to be discarded. If the wafer is marked for correction or discard the processor 14 may determine the type or types of adjustments to be made to the spacer deposition process to facilitate producing a spacer layer with a desired thickness. The processor 14 transmits these adjustments to a spacer deposition controller that controls the spacer deposition process accordingly. This may also be referred to as a feedback control system within the processor 14 that allows the processor 14 to determine necessary adjustments and to then instruct other components to make those adjustments in order to achieve the desired spacer thickness and deposition.

In the case of greater than desired vertical thickness (e.g., height), the processor 14 may mark the spacer and/or wafer to undergo chemical mechanical polishing for a pre-determined duration in order to mitigate discarding wafers due to spacer deposition errors. Furthermore, the processor 14 may produce one or more values that can be employed in controlling a post spacer deposition etch process to account for the excess spacer deposition. In the case of less than desired vertical thickness (e.g., height), the processor 14 may control the spacer deposition process to cause more spacer to be deposited.

The processor, or CPU 14, may be any of a plurality of processors, such as the AMD K7, Athlon and other similar and compatible processors. The manner in which the processor 14 can be programmed to carry out the functions relating to the present invention will be readily apparent to those having ordinary skill in the art based on the description provided herein.

A memory 16, which is operatively coupled to the processor 14, is also included in the system 20 and serves to store program code executed by the processor 14 for carrying out operating functions of the system 20 as described herein. The memory 16 also serves as a storage medium for temporarily storing information such as spacer thickness, spacer thickness tables, wafer coordinate tables, scatterometry information, and other data that may be employed in carrying out the present invention. A power supply 18 provides operating power to the system 20. Any suitable power supply (e.g., battery, line power) may be employed to carry out the present invention.

Figure 3:
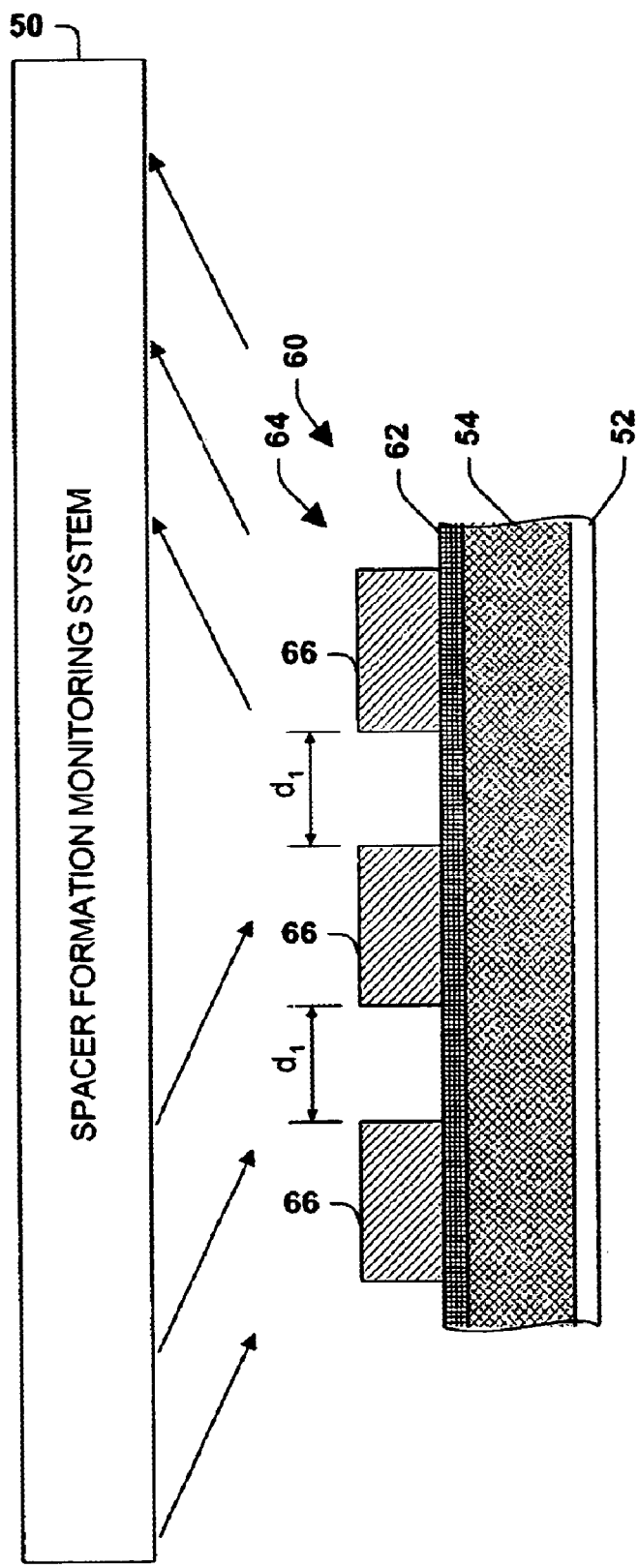
FIG. 3 is a schematic cross-sectional illustration of a semiconductor structure, whereupon features have been fabricated and whereupon there are spaces between features formed in accordance with an aspect of the present invention.

FIG. 3 illustrates a structure 60 that includes an oxide layer 52, a polysilicon layer 54, an anti-reflective coating layer 62 and a patterned photoresist layer 64. Formation of the structure 60 is well known in the art, and thus further detail concerning such formation is omitted for the sake of brevity. The photoresist layer 64 has been patterned, and in FIG. 3, three features 66 are separated by two substantially equally spaces measuring $d_1$. While three features 66 are illustrated, it is to be appreciated that a greater or lesser number of features may appear on a wafer being processed in accordance with the present invention. Further, although the spaces $d_1$ are illustrated in FIG. 3 as substantially equal, it is to be appreciated that various features may be separated by various width gaps. The spacer formation monitoring system 50 is illustrated as directing light onto the structure 60 and receiving back light reflected from the structure 60. Thus, measurements concerning the patterned photoresist layer 64 can be made, which can then be employed in determining one or more parameters associated with a spacer deposition process. For example, the measurement $d_1$ may be employed to determine a spacer deposition rate and/or time. The space $d_1$ between the features 66 can be important to determining transistor performance in a semiconductor incorporating the structure 60. Further, electrically isolating the features 66 can be important to reliable operation of a semiconductor incorporating the structure 60. Since each wafer may have unique critical dimensions that may require unique spacer deposition, the spacer formation monitoring system 50 can be employed to evaluate pre-spacer deposition critical dimensions (e.g., $d_1$) to facilitate pre-calculating spacer deposition parameters (e.g., time, rate).

Figure 4:
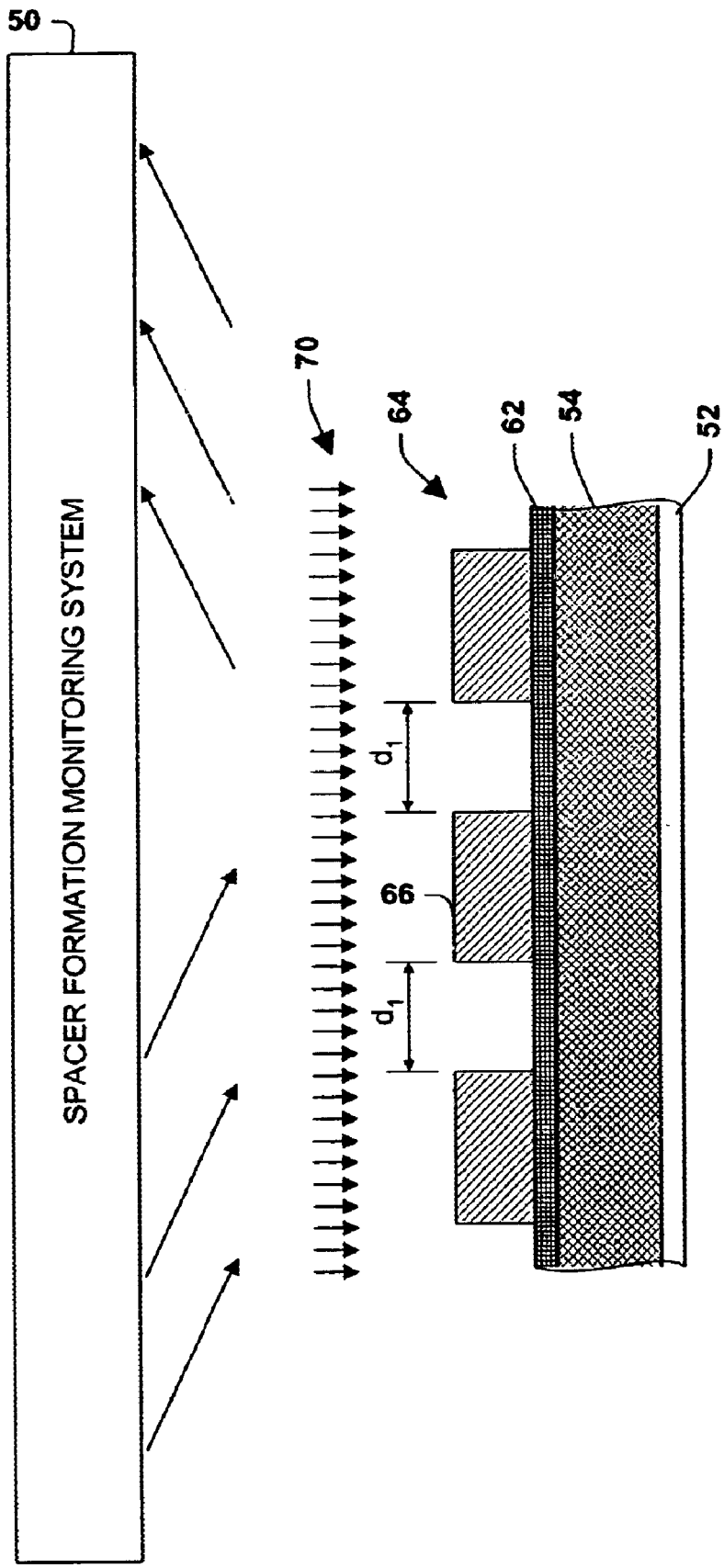
FIG. 4 is a schematic illustration of the semiconductor of FIG. 3 undergoing a deposition process to conformally deposit a spacer layer on the structure in accordance with the present invention.

FIG. 4 illustrates a spacer deposition step 70 performed on the structure 60 to form a polymer layer conformal to the exposed surface of the structure 60. Spacer deposition processes and techniques are well known in the art and thus are not discussed herein for the sake of brevity. The spacer formation monitoring system 50 is again illustrated as directing light onto the structure 60 and receiving back light reflected from the structure 60. Thus, measurements concerning the spacer deposition process 70 can be made, which can then be employed in situ to determine one or more parameters associated with controlling the spacer deposition process. For example, the reflected light may indicate that the spacer deposition process is proceeding too quickly, and thus the spacer formation monitoring system 50 may cause the deposition process to be slowed down. Similarly, the reflected light may indicate that the spacer deposition process is proceeding at a desired pace, and thus the spacer formation monitoring system 50 may cause the deposition process to be maintained at its current rate.

Figure 5:
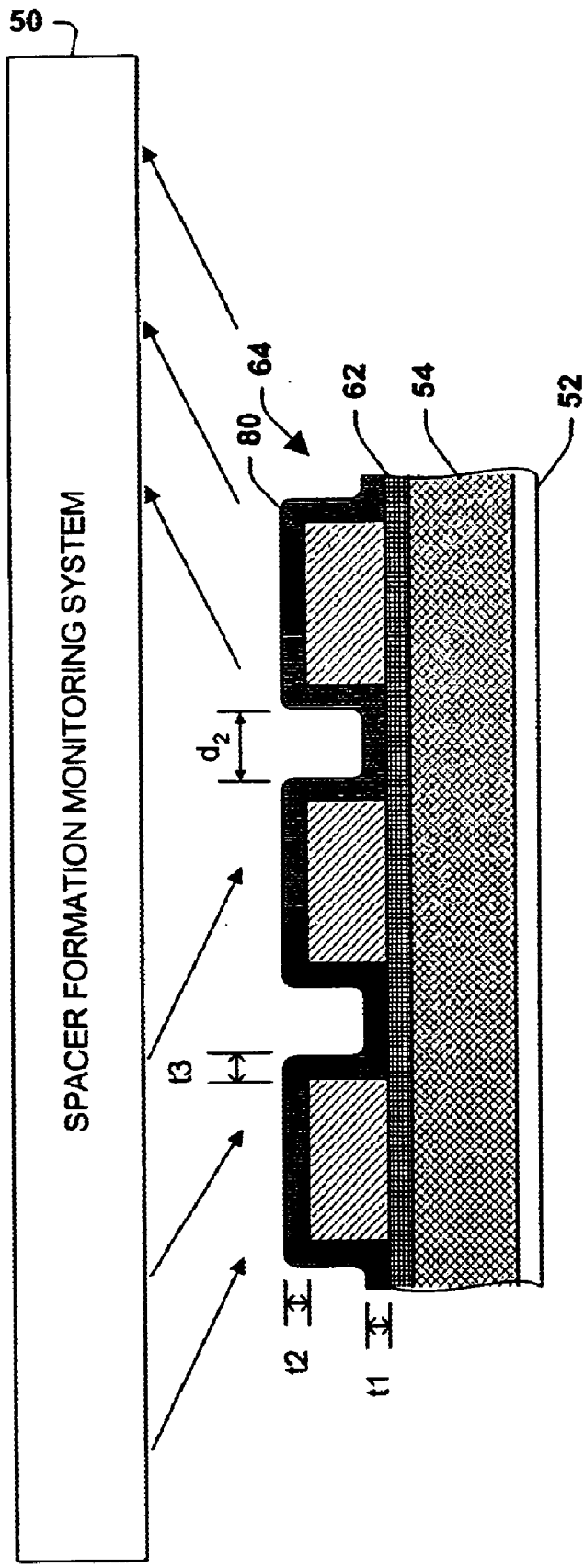
FIG. 5 is a schematic cross-sectional illustration of the structure of FIG. 4 after the spacer layer has been conformally formed on the structure.

FIG. 5 illustrates the structure 60 after the spacer deposition step 70 is substantially complete. A spacer layer 80 is conformal to the exposed surface of the structure 60 with, preferably, a substantially uniform thickness. It is to be appreciated that the spacer layer 80 may be formed from a variety of spacer compounds known in the art. The spacer formation monitoring system 50 is once again illustrated as directing light onto the structure 60 and receiving back light reflected from the structure 60. In FIG. 5, the presence of the spacer layer 80 will affect the light being reflected back to and analyzed by the spacer formation monitoring system 50. Thus, measurements concerning the spacer layer 80 can be made, which can then be employed in situ to determine one or more parameters associated with controlling a post spacer deposition etching process, for example. One or more measurements, (e.g., t1, t2, t3) may be made from the reflected light, thus measurements like $d_2$, for example, may be computed. For example, the dimension $d_2$ may be controlled according to the following relationship:

$$d_2 = d_1 - (2 \ast t3)$$

One or more measurements (e.g., t1, t2, t3) may be employed to determine whether additional spacer should be deposited on the wafer, whether the wafer has been damaged to the point where it must be discarded, or whether the wafer is ready for post spacer deposition processing (e.g., etching). If the wafer is ready for post spacer deposition processing (e.g., etching), then the measurements t1, t2 and t3, for example, may be employed in determining parameters for that post spacer deposition processing. For example, a first set of measurements t1, t2, t3 may indicate that a first set of etching parameters should be applied in post spacer deposition processing, while a second set of measurements t1', t2', t3' may indicate that a second set of etching parameters should be applied in post spacer deposition processing to facilitate achieving desired critical dimensions.

Each structure 60, and each wafer upon which a structures like the structure 60 appear may have unique critical dimensions. Conventional systems may not account for such unique critical dimensions and thus pre-determined approximations may be employed in determining post spacer deposition etch parameters. Thus, by analyzing light reflected from the structure 60 and/or the spacer layer 80, the present invention provides advantages over such conventional systems.

Figure 6:
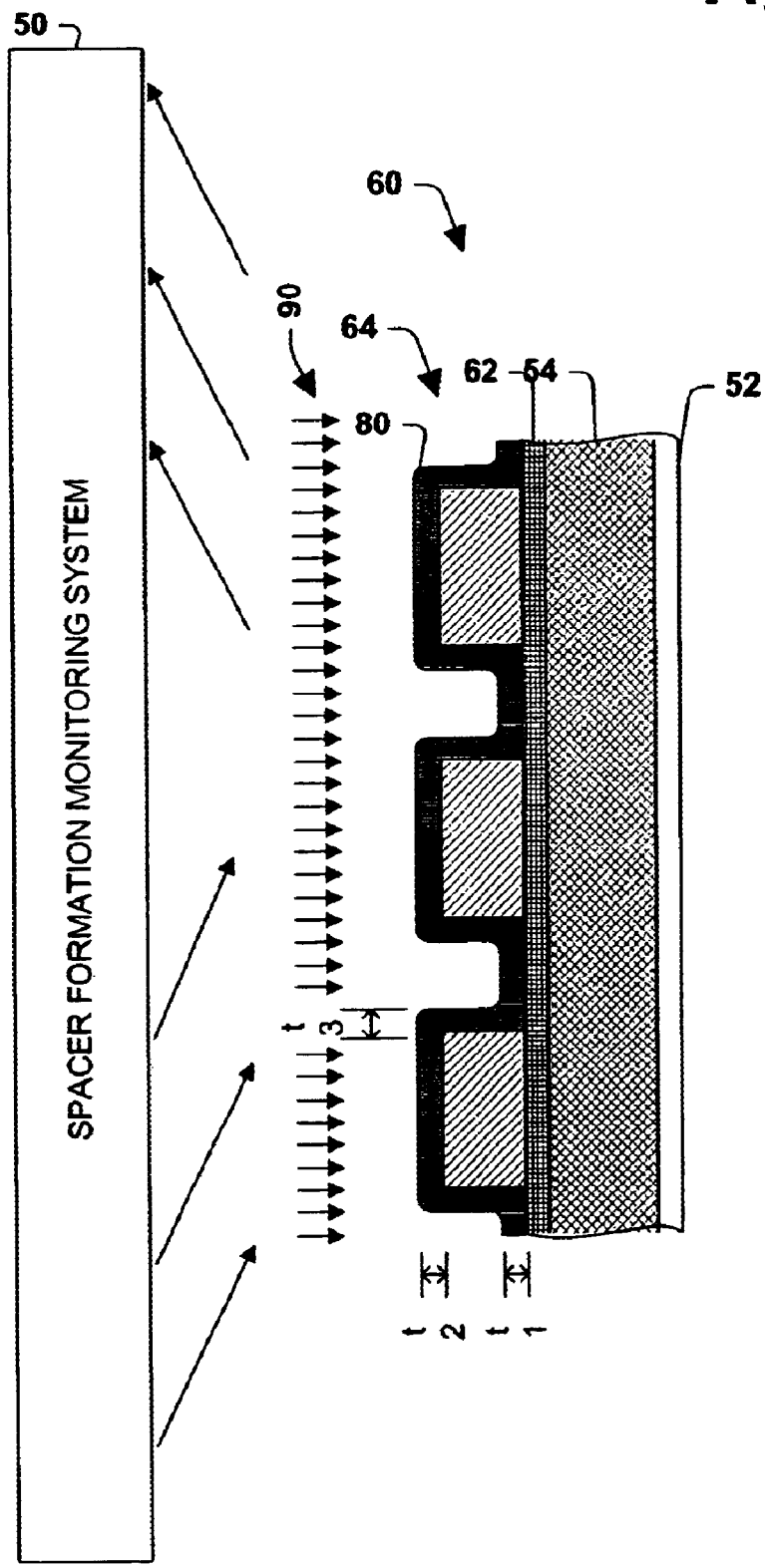
FIG. 6 is a schematic cross-sectional illustration of the structure of FIG. 5 undergoing an etch of the spacer layer in accordance with the present invention.

FIG. 6 illustrates an etch step 90 being performed to remove a thickness of the spacer layer 80. Preferably, the etch 90 is performed to remove an amount of the spacer layer 80 equivalent to the conformal thickness of the spacer layer 80. Conventionally, approximations or pre-determined amounts of spacer may have been removed from the spacer layer 80. But the present invention, by facilitating analyzing the spacer layer 80, including its thickness, coverage and uniformity, provides advantages over conventional systems in that a more precise measurement concerning the amount of spacer to be removed from the spacer layer 80 can be calculated, leading to improvements in achieving desired critical dimensions.

Figure 7:
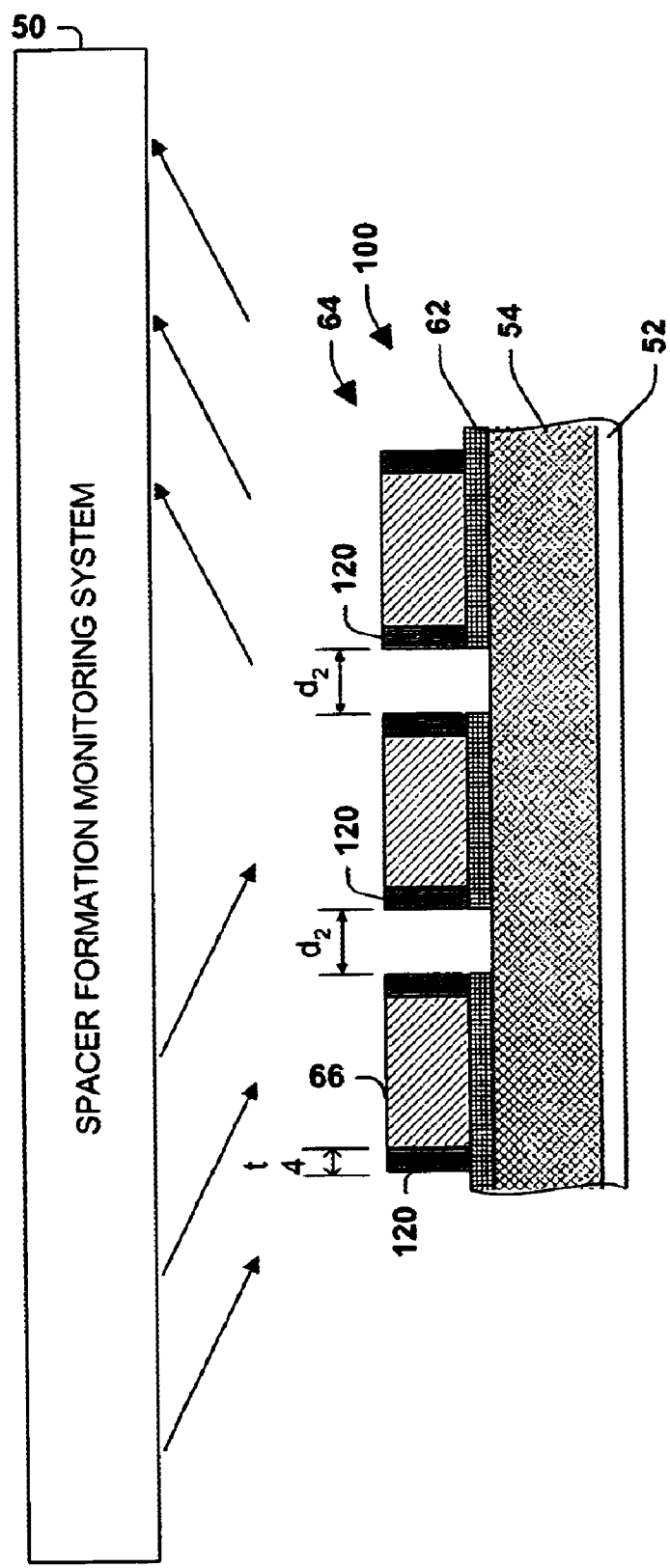
FIG. 7 is a schematic cross-sectional illustration of the structure of FIG. 6 after the etch is complete in accordance with an aspect of the present invention.

Substantial completion of the etch step 90 results in a structure 100 shown in FIG. 7. The structure 100 illustrates the features 66 being separated by substantially equal spaces measuring $d_2$. While three features 66 are illustrated, it is to be appreciated that a greater or lesser number of features may appear on a wafer being processed in accordance with the present invention. Further, although the spaces $d_2$ are illustrated in FIG. 7 as substantially equal, it is to be appreciated that various features may be separated by various width gaps. Reliable operation of a semiconductor incorporating the structure 100 may rely on the distance $d_2$, which can be shown to measure $d_1-(2*t4)$. The precision of the etching illustrated in FIG. 6, which produced the gaps of size $d_2$ in FIG. 7, is facilitated by the present invention providing both in situ spacer deposition information and post spacer deposition measurements.

In FIG. 7, the spacer formation monitoring system 50 is illustrated as directing light onto the structure 100 and receiving back light reflected from the structure 100. Thus, measurements concerning the results of the spacer deposition process and the post spacer deposition etching process can be made, which can then be employed to determine whether desired critical dimensions have been achieved. For example, the reflected light may indicate that the spacer deposition process has produced wafers with unacceptable critical dimensions, and thus the wafers should be scrapped. For example, the gaps $d_2$ may be too small, because one or more spacer deposits 120 associated with one or more features 66 are too wide.

Turning now to FIGS. 8–10 a chuck 30 is shown in perspective supporting a wafer 22 thereon, whereupon spacer is deposited. The wafer 22 may be divided into a grid pattern 28 as that shown in FIG. 8. Each grid block (XY) of the grid pattern corresponds to a particular portion of the wafer 22 and each grid block may have one or more spacer deposit measurements associated with that grid block. Each portion may be individually monitored for spacer thickness and each portion may be individually controlled for spacer deposit.

In FIG. 9, the portions of the wafer ($X_1Y_1 \ldots X_{12}, Y_{12}$) are being monitored for thickness using reflected light, the measuring system 50 and the processor 14. Thickness measurements from the different portions of the wafer are shown. As can be seen, the thickness at coordinate $X_7Y_6$ is substantially higher than the thickness of the other wafer 22 portions XY. FIG. 9 illustrates the wafer 22 being mapped (partitioned) into 144 grid block portions, however it should be appreciated that the wafer 22 may be mapped with any suitable number of portions.

FIG. 10 is a representative table of thickness measurements (taken for the various grid blocks) that have been correlated with acceptable thickness values for the portions of the wafer 22 mapped by the respective grid blocks. As can be seen, all the grid blocks, except grid block $X_7Y_6$, have thickness measurements corresponding to an acceptable thickness value ($T_A$) (e.g., are within an expected range of thickness measurements), while grid block $X_7Y_6$ has an undesired thickness value ($T_U$). Thus, the processor 14 has determined that an undesirable thickness condition exists at the portion of the wafer 22 mapped by grid block $X_7Y_6$. Accordingly, the processor 14 can control spacer deposition for the portion of the wafer 22 mapped at grid block $X_7Y_6$, to bring the spacer thickness of this portion of the wafer 22 to an acceptable level. It is to be appreciated that the spacer deposition process may be driven so as to increase, decrease and/or maintain the rate of spacer deposition as desired.

Figure 11:
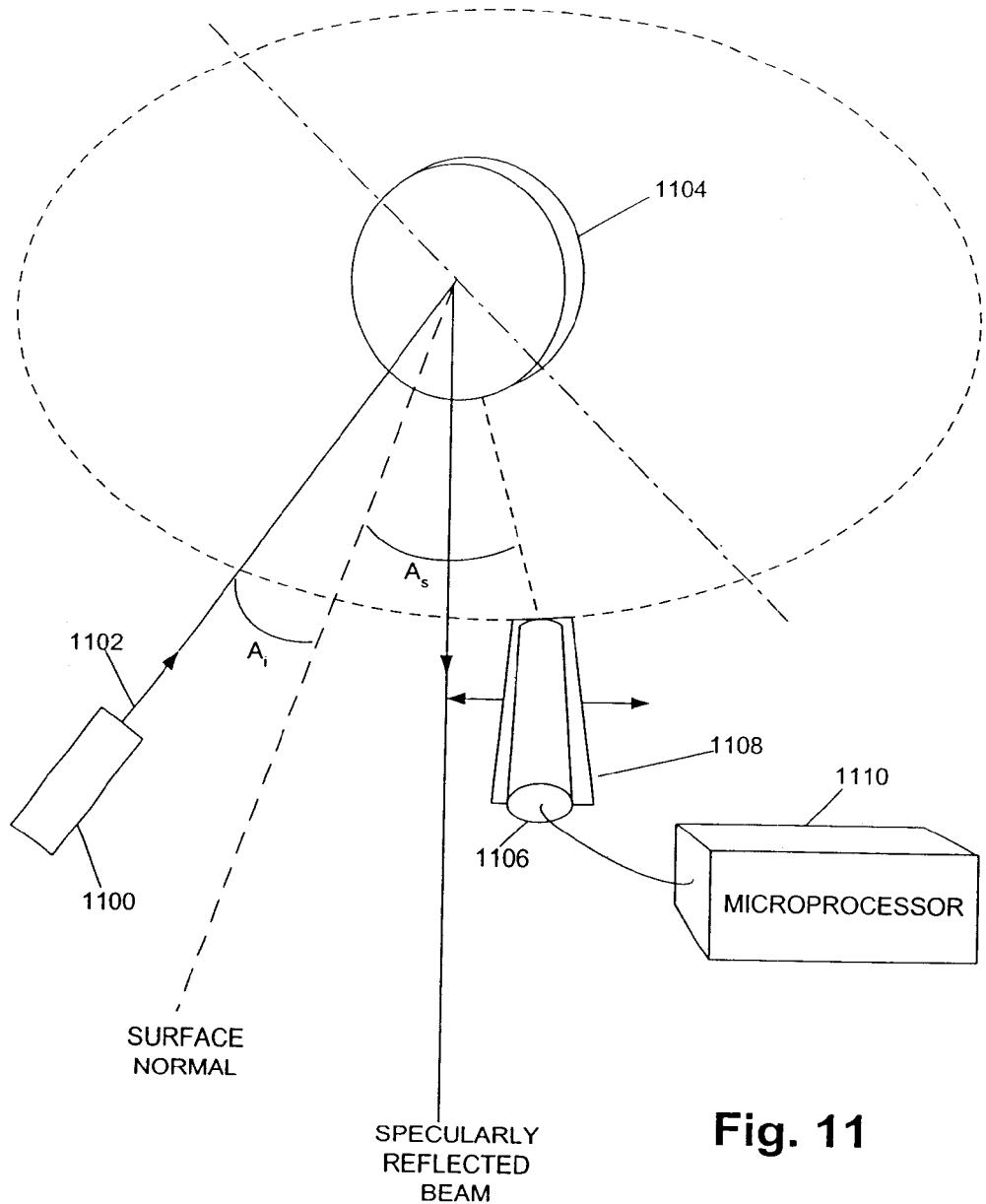
FIG. 11 is an example scatterometry system collecting reflected light in accordance with an aspect of the present invention.

FIG. 11 illustrates an exemplary scatterometry system collecting reflected light. Light from a laser 1100 is brought to focus in any suitable well-known manner to form a beam 1102. A sample, such as a wafer 1104 is placed in the path of the beam 1102 and a photo detector or photo multiplier 1106 of any suitable well-known construction. Different detector methods may be employed to determine the scattered power. To obtain a grating pitch, the photo detector or photo multiplier 1106 may be mounted on a rotation stage 1108 of any suitable well-known design. A microprocessor 1110, of any suitable well-known design, may be used to process detector readouts, including but not limited to angular locations of different diffracted orders leading to diffraction grating pitches being calculated. Thus, light reflected from the sample 1104 may be accurately measured.

Figure 12:
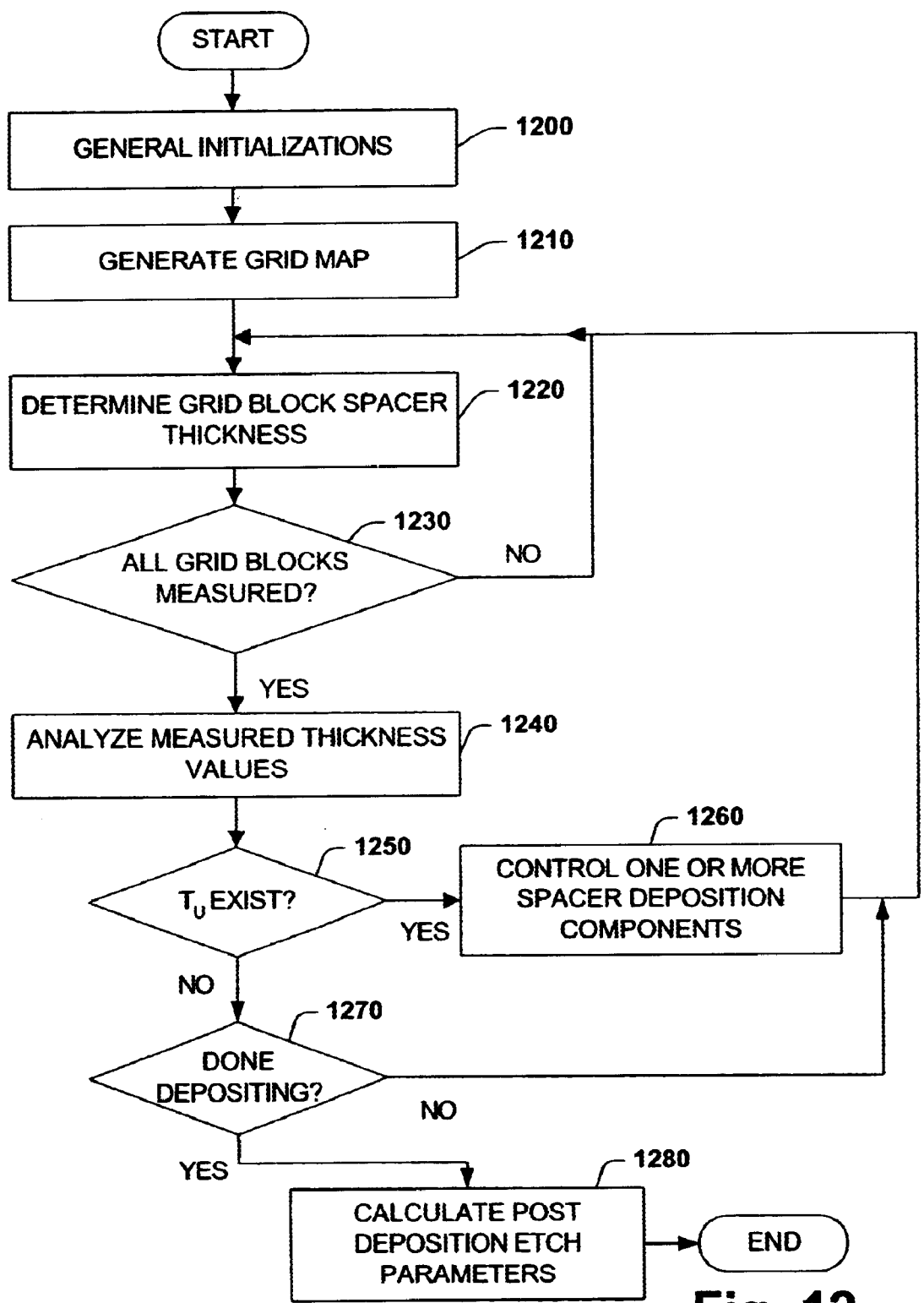
FIG. 12 is a flow diagram illustrating one specific methodology for carrying out the present invention.

In view of the exemplary systems shown and described above, methodologies, which may be implemented in accordance with the present invention will be better appreciated with reference to the flow diagram of FIG. 12. While for purposes of simplicity of explanation, the illustrated methodology is shown and described as a series of blocks, it is to be understood and appreciated that the present invention is not limited by the order of the blocks, as some blocks may, in accordance with the present invention, occur in different orders and/or concurrently with other blocks from that shown and described herein. Moreover, not all illustrated blocks may be required to implement a methodology in accordance with the present invention. Further, additional and/or alternative methodologies may employ additional blocks not illustrated herein.

FIG. 12 is a flow diagram illustrating one particular methodology for carrying out the present invention. At 1200 general initializations occur. Such initializations can include, but are not limited to, allocating memory, establishing pointers, establishing data communications, acquiring resources, setting variables and displaying process activity. At 1210 a grid map is generated on a wafer that will be processed in accordance with the present invention. One or more features and/or gratings may appear in each of the portions of the grid. Light is then directed at the one or more portions of the grid, and reflected light is collected. At 1220, grid block spacer thickness measurements and/or analyses are performed. Such measurements can include thickness, uniformity and coverage, for example. The reflected light can be analyzed by comparing one or more signatures gathered from the reflected light to one or more stored signatures. Such comparison can be employed to determine whether the spacer deposition is occurring at a desired rate, in a desired manner and whether the spacer deposition process should be altered.

At 1230, a determination is made concerning whether all the grid blocks have been measured. In one example of the present invention, all grid blocks are measured and the results are employed to control deposition. In another example of the present invention, one or more representative grid blocks are measured, and the results from this smaller set of grid blocks are employed to control deposition. At 1240, the measurements of 1220 are analyzed. For example, the thickness measurements may be analyzed to determine whether the spacer deposition is occurring at a desired rate, in a desired manner and whether the spacer deposition process should be altered.

At 1250 a determination is made concerning whether there are any unacceptable measurements. For example, a determination concerning whether there are any unacceptable thickness measurements $T_U$ may be made. If the determination at 1250 is YES, then at 1260, one or more spacer deposition components may be controlled to alter the spacer deposition process. By way of illustration, if one area of the wafer upon which spacer is being deposited has too much spacer relative to other portions, then the spacer deposition process may be altered to reduce the amount of spacer being deposited in the offending area.

At 1270 a determination is made concerning whether the deposition process is complete. If the determination at 1270 is NO, then processing returns to 1220. But if the determination at 1270 is YES, then at 1280 values may be computed to facilitate controlling one or more post spacer deposition processes. By way of illustration, the thickness of one or more portions of a spacer layer may be analyzed to produce parameters employed in a post spacer deposition etch process. For example, if a spacer layer is slightly thicker than anticipated, then more etching than was originally scheduled may be performed, but if a spacer layer is slightly thicker than anticipated, then less etching than was originally scheduled may be performed. Thus, unique properties associated with spacer deposition on individual wafers may be accounted for, leading to achieving desired critical dimensions and producing increases in yields over conventional systems.

Scatterometry is a technique for extracting information about a surface upon which an incident light has been directed. Information concerning properties including, but not limited to, dishing, erosion, profile, thickness of thin films and, critical dimensions of features present on the surface can be extracted. The information can be extracted by comparing the phase and/or intensity of the light directed onto the surface with phase and/or intensity signals of a complex reflected and/or diffracted light resulting from the incident light reflecting from and/or diffracting through the surface upon which the incident light was directed. The intensity and/or the phase of the reflected and/or diffracted light will change based on properties of the surface upon which the light is directed. Such properties include, but are not limited to, the chemical properties of the surface, the planarity of the surface, features on the surface, voids in the surface, and the number and/or type of layers beneath the surface.

Different combinations of the above-mentioned properties will have different effects on the phase and/or intensity of the incident light resulting in substantially unique intensity/phase signatures in the complex reflected and/or diffracted light. Thus, by examining a signal (signature) library of intensity/phase signatures, a determination can be made concerning the properties of the surface. Such substantially unique phase/intensity signatures are produced by light reflected from and/or refracted by different surfaces due, at least in part, to the complex index of refraction of the surface onto which the light is directed. The complex index of refraction (N) can be computed by examining the index of refraction (n) of the surface and an extinction coefficient (k). One such computation of the complex index of refraction can be described by the equation:

$$N=n-jk$$

where j is an imaginary number.

The signal (signature) library can be constructed from observed intensity/phase signatures and/or signatures generated by modeling and simulation. By way of illustration, when exposed to a first incident light of known intensity, wavelength and phase, a first feature on a wafer can generate a first phase/intensity signature. Similarly, when exposed to the first incident light of known intensity, wavelength and phase, a second feature on a wafer can generate a second phase/intensity signature. For example, a line of a first width may generate a first signature while a line of a second width may generate a second signature. Observed signatures can be combined with simulated and modeled signatures to form the signal (signature) library. Simulation and modeling can be employed to produce signatures against which measured phase/intensity signatures can be matched. In one exemplary aspect of the present invention, simulation, modeling and observed signatures are stored in a signal (signature) library containing over three hundred thousand phase/intensity signatures. Thus, when the phase/intensity signals are received from scatterometry detecting components, the phase/intensity signals can be pattern matched, for example, to the library of signals to determine whether the signals correspond to a stored signature.

Figure 13:
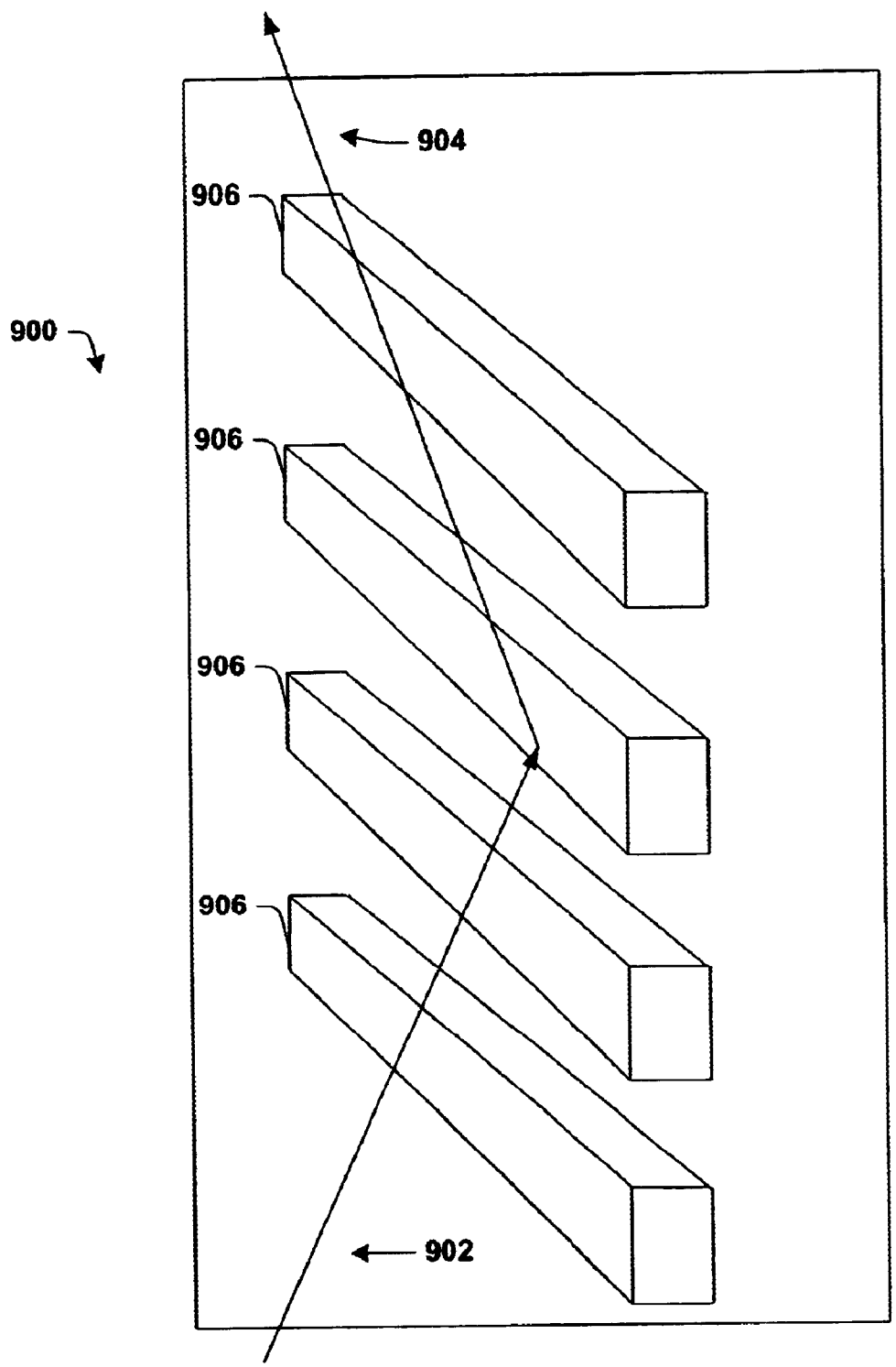
FIG. 13 is a simplified perspective view of an incident light reflecting off a surface, in accordance with an aspect of the present invention.
Figure 18:
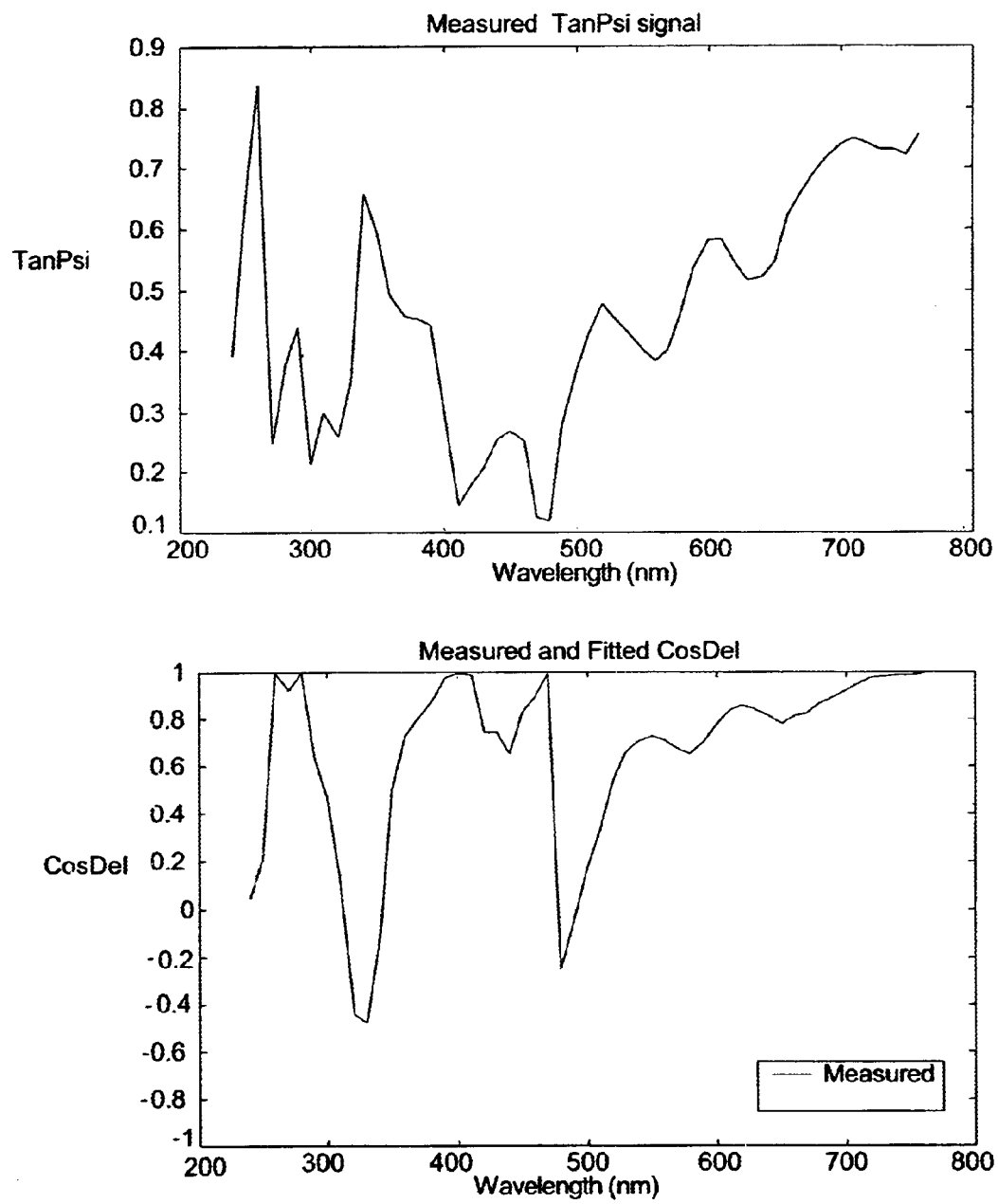
FIG. 18 illustrates phase and intensity signals recorded from a complex reflected and refracted light produced when an incident light is directed onto a surface, in accordance with an aspect of the present invention.

To illustrate the principles described above, reference is now made to FIGS. 13 through 18. Referring initially to FIG. 13, an incident light 902 is directed at a surface 900, upon which one or more features 906 may exist. In FIG. 13 the incident light 902 is reflected as reflected light 904. The properties of the surface 900, including but not limited to, thickness, uniformity, planarity, chemical composition and the presence of features, can affect the reflected light 904. In FIG. 13, the features 906 are raised upon the surface 900. The phase and intensity of the reflected light 904 can be measured and plotted, as shown, for example, in FIG. 18. The phase 960 of the reflected light 904 can be plotted, as can the intensity 962 of the reflected light 904. Such plots can be employed to compare measured signals with signatures stored in a signature library using techniques like pattern matching, for example.

Figure 14:
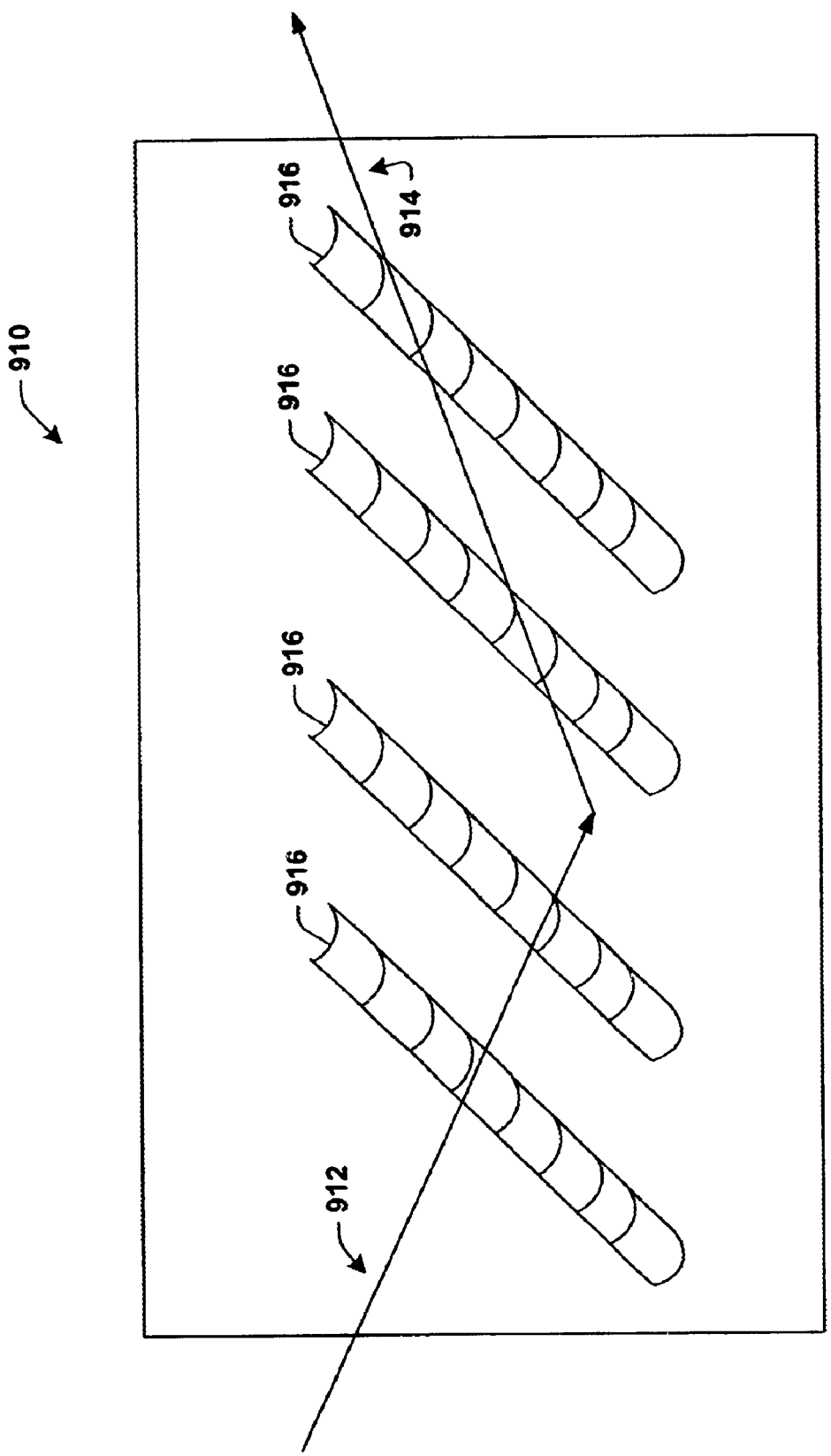
FIG. 14 is a simplified perspective view of an incident light reflecting off a surface, in accordance with an aspect of the present invention.

Referring now to FIG. 14, an incident light 912 is directed onto a surface 910 upon which one or more depressions 916 appear. The incident light 912 is reflected as reflected light 914. Like the one or more features 906 (FIG. 13) may affect an incident beam, so too may the one or more depressions 916 affect an incident beam. Thus, it is to be appreciated by one skilled in the art that scatterometry can be employed to measure features appearing on a surface, features appearing in a surface, and properties of a surface itself, regardless of features.

Figure 15:
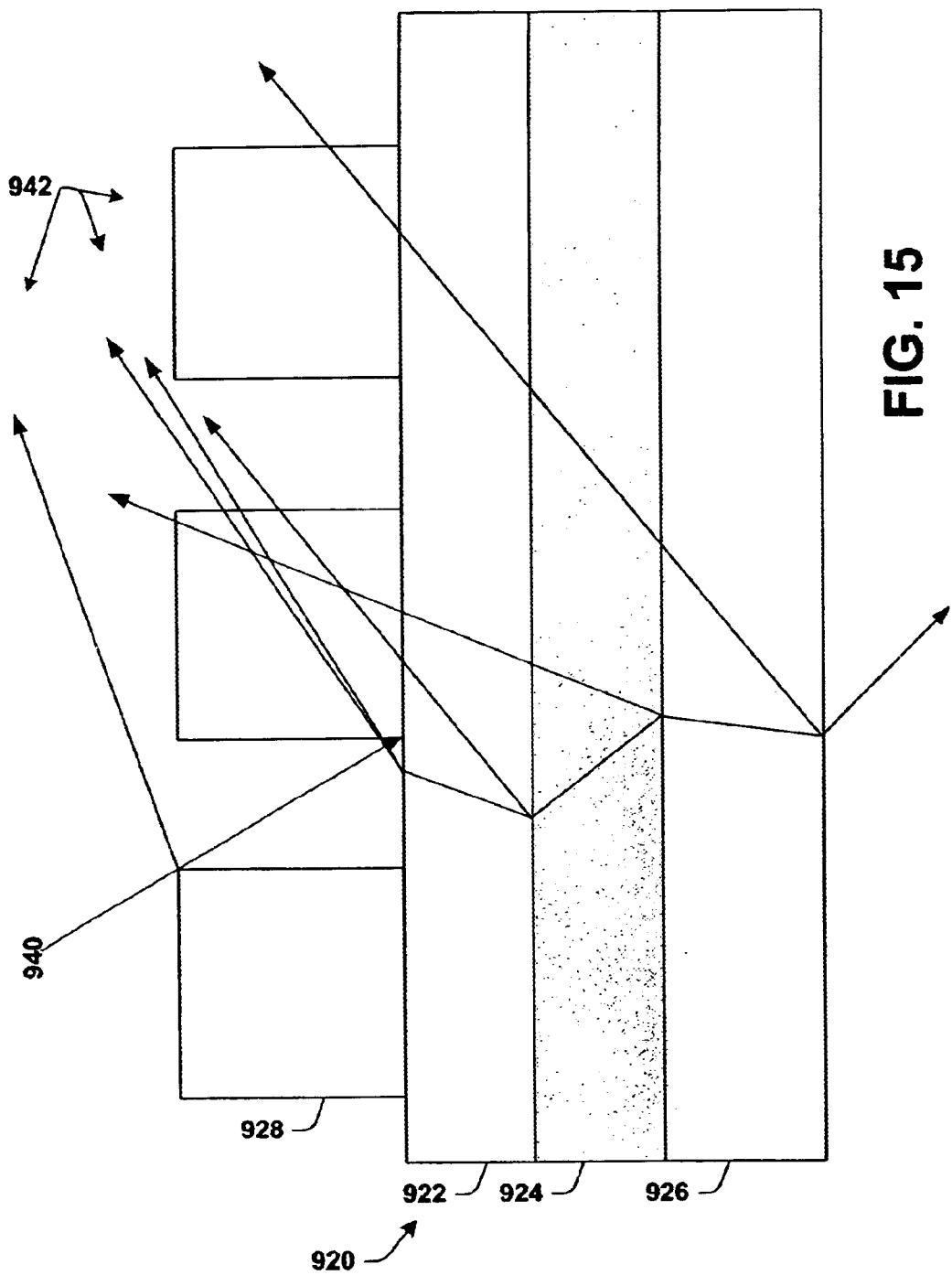
FIG. 15 illustrates a complex reflected and refracted light produced when an incident light is directed onto a surface, in accordance with an aspect of the present invention.

Turning now to FIG. 15, complex reflections and refractions of an incident light 940 are illustrated. The reflection and refraction of the incident light 940 can be affected by factors including, but not limited to, the presence of one or more features 928, and the composition of the substrate 920 upon which the features 928 reside. For example, properties of the substrate 920 including, but not limited to the thickness of a layer 922, the chemical properties of the layer 922, the opacity and/or reflectivity of the layer 922, the thickness of a layer 924, the chemical properties of the layer 924, the opacity and/or reflectivity of the layer 924, the thickness of a layer 926, the chemical properties of the layer 926, and the opacity and/or reflectivity of the layer 926 can affect the reflection and/or refraction of the incident light 940. Thus, a complex reflected and/or refracted light 942 may result from the incident light 940 interacting with the features 928, and/or the layers 922, 924 and 926. Although three layers 922, 924 and 926 are illustrated in FIG. 15, it is to be appreciated by one skilled in the art that a substrate can be formed of a greater or lesser number of such layers.

Figure 16:
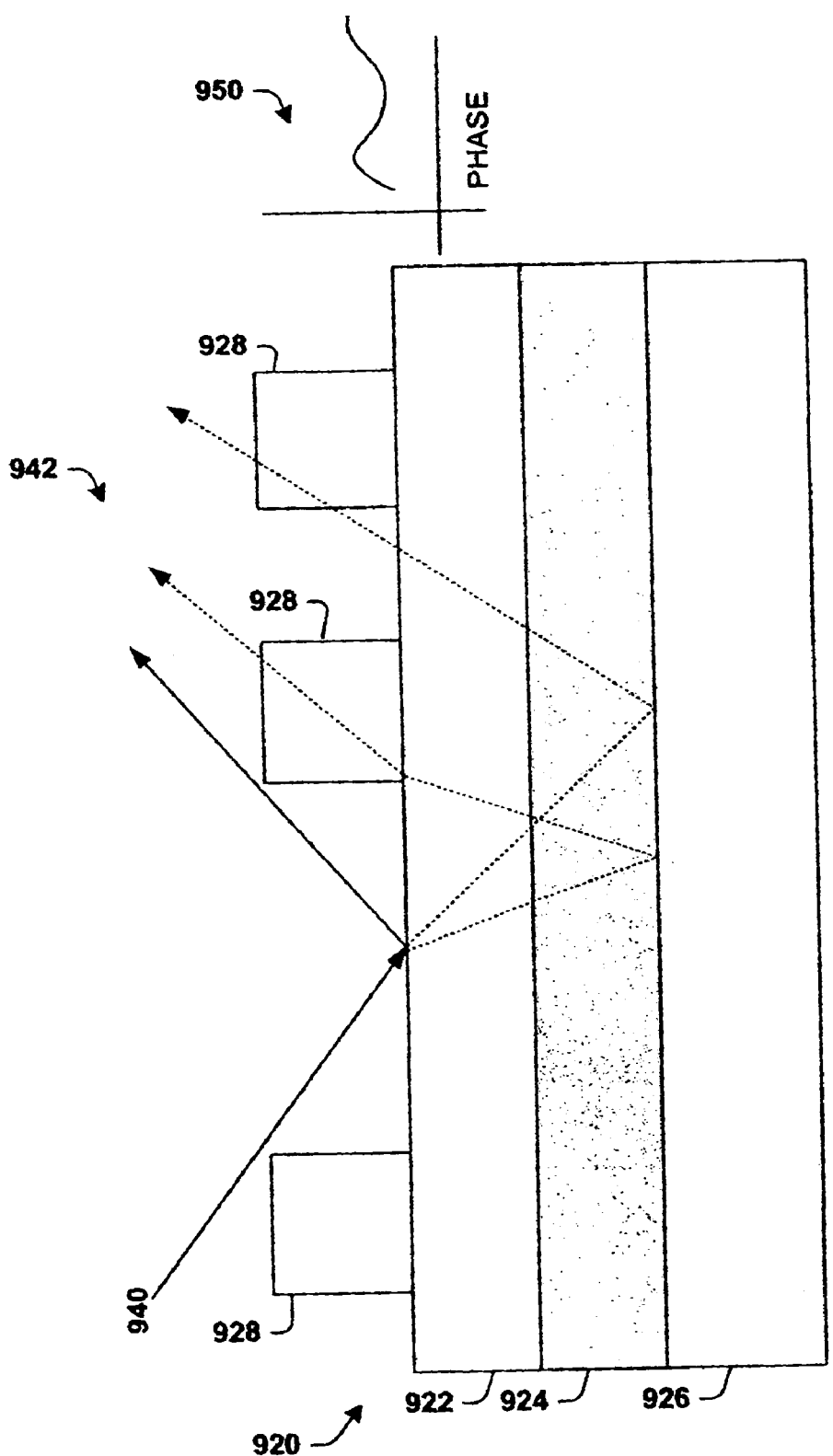
FIG. 16 illustrates a complex reflected and refracted light produced when an incident light is directed onto a surface, in accordance with an aspect of the present invention.
Figure 17:
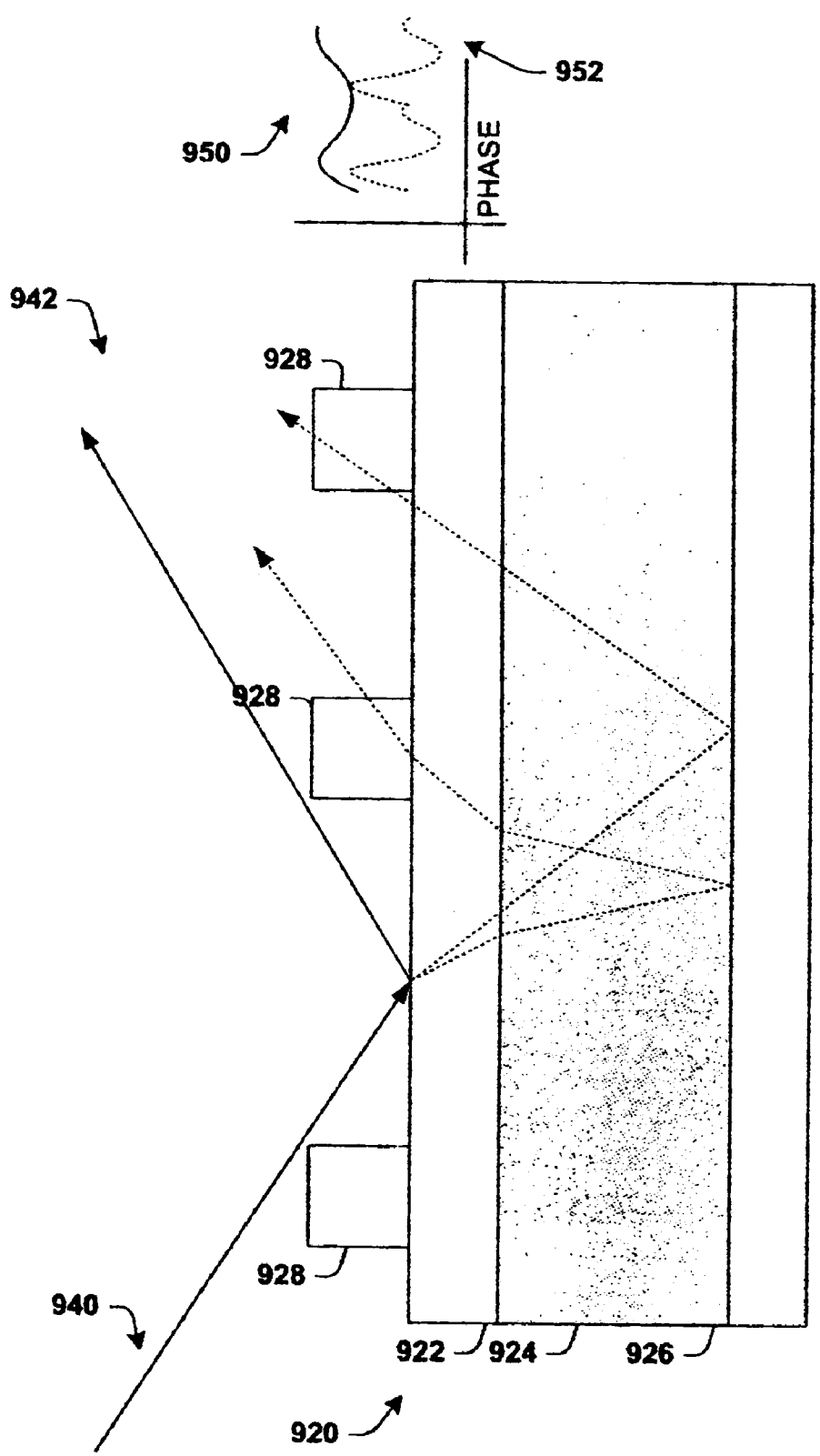
FIG. 17 illustrates a complex reflected and refracted light produced when an incident light is directed onto a surface, in accordance with an aspect of the present invention.

Turning now to FIG. 16, one of the properties from FIG. 15 is illustrated in greater detail. The substrate 920 can be formed of one or more layers 922, 924 and 926.

The phase 950 of the reflected and/or refracted light 942 can depend, at least in part, on the thickness of a layer, for example, the layer 924. Thus, in FIG. 17, the phase 952 of the reflected light 942 differs from the phase 950 due, at least in part, to the different thickness of the layer 924 in FIG. 17.

Thus, scatterometry is a technique that can be employed to extract information about a surface upon which an incident light has been directed. The information can be extracted by analyzing phase and/or intensity signals of a complex reflected and/or diffracted light. The intensity and/or the phase of the reflected and/or diffracted light will change based on properties of the surface upon which the light is directed, resulting in substantially unique signatures that can be analyzed to determine one or more properties of the surface upon which the incident light was directed.

The present invention provides for a system and method for regulating spacer deposition. As a result, the present invention facilitates improving density packings, chip integrity and chip reliability, which in turn increases chip performance in accordance with the present invention.

Described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A precise measurement control system for regulating spacer deposition on a semiconductor device comprising at least a substrate, an oxide layer, a polysilicon layer, an anti-reflective layer, a patterned photoresist layer, a spacer layer and a plurality of gratings, the precise measurement control system comprising:

a controller that controls a spacer deposition component to deposit a spacer on a portion of a wafer;

a light source to project light onto the portion of the wafer;

a light collecting device that collects at least reflected light from the spacer on the portion of the wafer, and utilizes the reflected light for measuring one or more spacer parameters associated with the deposited spacer;

a memory that comprises a signal signature library and a standard set of parameters;

a power supply for providing power to the precise measurement control system; and, a processor comprising at least one cpu operatively coupled to the light collecting device and the controller, wherein the processor comprising at least one cpu receives one or more spacer parameters, including thickness, coverage and uniformity, from the light collecting device, and the at least one cpu analyzes the parameters by comparing the parameters to stored acceptable spacer parameters, including thickness, coverage and uniformity, and provides instructions to a feedback control system based on the analyzed parameters to adjust the rate of spacer deposition on the portion of the wafer and on subsequent wafers.

2. The precise measurement control system of claim 1, wherein the processor comprising at least one cpu generates a signal to control a post spacer thickness reduction step.

3. The precise measurement control system of claim 2, where the post spacer thickness reduction step is an etching step.

4. The precise measurement control system of claim 1, wherein the processor comprising at least one cpu employs a non-linear training system based at least in part on one or more of back propagation, Bayesian theory, fuzzy sets, non-linear regression, mixture of exports, cerebella model arithmetic computer (CMACS), radial basis functions, directed search networks and function link networks to facilitate determining adjustments to spacer deposition.

5. The precise measurement control system of claim 1, the processor mapping the wafer into a plurality of grid blocks to identify a portion of spacer deposition within a grid block.

6. The precise measurement control system of claim 1, wherein the processor comprising at least one cpu determines the existence of an unacceptable parameter of the wafer based upon the received parameter compared to stored acceptable parameter values.

7. The precise measurement control system of claim 1, wherein the processor comprising at least one cpu feeds the feedback control system to input the controller to adjust the rate of spacer deposition on the at least one portion to produce acceptable deposited spacer.

8. The precise measurement control system of claim 1, wherein the power supply is a battery or line power.

9. The precise measurement control system of claim 1, wherein the light source is a laser diode or a helium neon (HeNe) gas laser.

10. The precise measurement control system of claim 1, wherein the light collecting device is a scatterometry system.

* * * * *